United States Patent [19]
Melbert et al.

[11] Patent Number: 4,645,986
[45] Date of Patent: Feb. 24, 1987

[54] DEFLECTIONAL SYSTEM FOR A TELEVISION SET COMPRISING A POWER TRANSISTOR

[75] Inventors: Joachim G. Melbert, Steinhöring; Eduard Sawicki, Munich, both of Fed. Rep. of Germany

[73] Assignee: SGS Halbleiter-Bauelemente GmbH, Grafing, Fed. Rep. of Germany

[21] Appl. No.: 739,367

[22] Filed: May 30, 1985

[30] Foreign Application Priority Data

May 30, 1984 [DE] Fed. Rep. of Germany ....... 3420312

[51] Int. Cl.⁴ ......................... H01J 29/70; H01J 29/72
[52] U.S. Cl. ................................................. 315/387
[58] Field of Search ......................... 315/387, 388, 389

[56] References Cited

U.S. PATENT DOCUMENTS

| 4,147,963 | 4/1979 | Shiotani | 315/387 |
| 4,442,384 | 4/1984 | Maekawa et al. | 315/387 |
| 4,536,682 | 8/1985 | Ten Pierick | 315/387 |

FOREIGN PATENT DOCUMENTS

| 0045882 | 2/1982 | European Pat. Off. |
| 0159233 | 10/1985 | European Pat. Off. |
| 1908276 | 9/1969 | Fed. Rep. of Germany |
| 2046015 | 3/1972 | Fed. Rep. of Germany |
| 2337800 | 1/1977 | Fed. Rep. of Germany |
| 2405482 | 3/1979 | Fed. Rep. of Germany |
| 2649718 | 7/1979 | Fed. Rep. of Germany |
| 2842726 | 4/1981 | Fed. Rep. of Germany |
| 2613372 | 10/1981 | Fed. Rep. of Germany |
| 3043354 | 7/1982 | Fed. Rep. of Germany |

OTHER PUBLICATIONS

IBM Technical Disclosure Bulletin, vol. 17, No. 4, Sep. 1974, K. H. Knickmeyer, pp. 1091–1092.
Arentsen et al, Electronic Applications, vol. 34, No. 2, Philips Semiconductor Application Lab., pp. 52–60.
Loewe Opta, Circuit Schematic, Aug. 1st, 1980.
Thomson–Brandt, Circuit Schematic, Apr. 15th, 1981.
Blaupunkt, Circuit Schematic, (undated).
Grundig, Circuit Schematic, (undated).
ITT, Circuit Schematic, (undated).
Telefunken, Circuit Schematic, (undated).
Schneider, Circuit Schematic, (undated).

*Primary Examiner*—Theodore M. Blum
*Attorney, Agent, or Firm*—Spencer & Frank

[57] ABSTRACT

The invention relates to a deflectional system of a television set comprising a power transistor and a driving circuit which supplies a deflection current increasing in ramp-shaped manner to a deflection coil. The driving circuit is periodically fed with switching-on pulses of a duration corresponding to the ramp length of the deflecting current. The driving circuit applies an increasing switched-on base current to the power transistor during the switching-on pulse duration, said switched-on base current driving the power transistor into the saturation state during substantially the entire switching-on pulse duration. After termination of the switching-on pulse, the driving circuit controls the power transistor with a switching-off base current which rapidly decreases in relation to the increase of the switched-on base current and finally changes polarity and which effects a rapid return of the power transistor from the saturation state into the blocking state. The power transistor has a sensor means associated therewith which supplies to the driving circuit an actual-value signal which is proportional to the instantaneous value of the transistor main current. The driving circuit regulates the switched-on base current, during the entire increase thereof and in accordance with said actual-value signal, to a value which maintains the power transistor in the saturated stated with only a slight degree of saturation. The driving circuit controls the steepness of the switching-off base current proportionally to the actual-value signal occurring at the end of the switching-on pulse.

15 Claims, 8 Drawing Figures

DEFLECTIONAL SYSTEM FOR A TELEVISION SET COMPRISING A POWER TRANSISTOR

BACKGROUND OF THE INVENTION

The present invention relates to a deflectional system for a television set comprising a power transistor and a driving circuit means and more, particularly to a driving circuit which supplies a deflecting current, increasing in a ramp-shaped manner, to a deflection coil, the driving circuit being periodically fed with switching-on pulses of a duration corresponding to the ramp length of the deflecting current, and applying an increasing switched-on base current to the power transistor during the switching-on pulse duration, the switched-on base current driving the power transistor into the saturation state during substantially the entire switching-on pulse duration, and after termination of the switching-on pulse, the driving circuit controlling the power transistor with a switching-off base current which rapidly decreases in relation to the increase of the switched-on base current and finally changes polarity and which effects a rapid return of the power transistor from the saturation state into the blocking state.

Figure 1A:
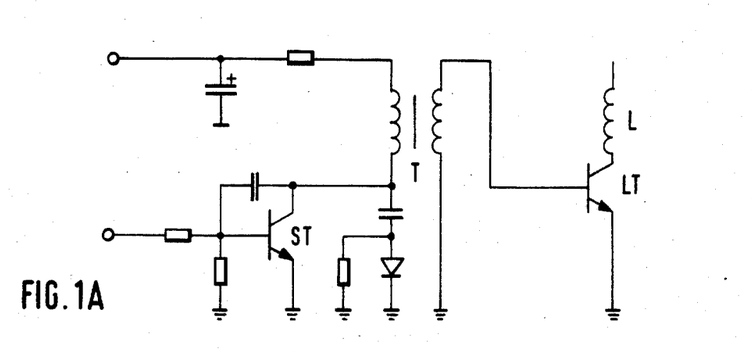
FIGS. 1A, 1B and 1C are circuit schematics of three conventional driving circuits for the power transistor in the horizontal deflection stage of a television set.
Figure 1B:
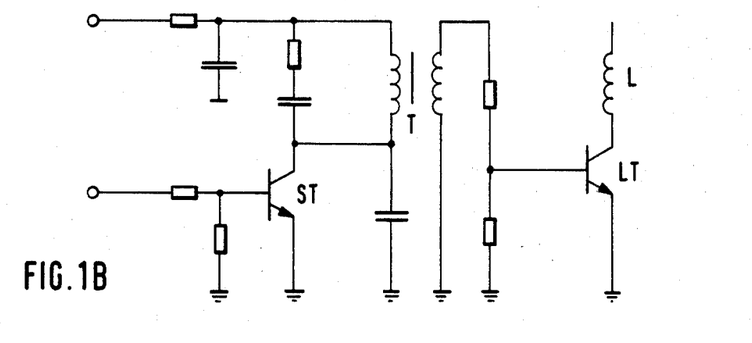
Figure 1C:
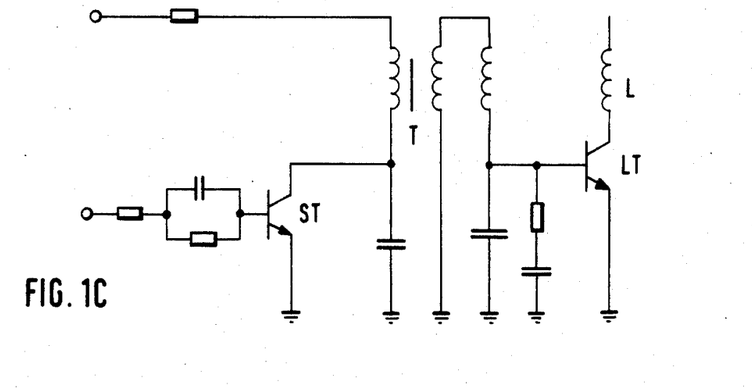

This deflectional system is intended to be used mainly in the horizontal deflection stage of television sets and video monitors. Conventional circuits for driving the power transistor in the horizontal deflection stage are realized by discrete component parts. Three characteristic examples of such conventional circuits are shown in FIGS. 1A, 1B and 1C. All three of these circuits comprise a power transistor LT the collector of which supplies current to a deflection coil L and the base circuit of which is connected to a driver circuit via a transformer T. Each driver circuit comprises a control transistor ST to the base of which line-frequency switching-on pulses can be supplied, which bring the control transistor ST into the conducting state.

On the collector side of the power transistor LT, there is provided a complex circuit which, when the voltage across the deflection coil L is constant, effects a current increasing with a constant steepness, as long as the power transistor LT is switched into the conductive state and is capable of supplying a correspondingly high current. In order to be able to maintain the condition of a constant voltage accross the deflection coil L, one takes care that the emitter-collector path of the power transistor LT has a constant voltage drop during the switching-on time. This is achieved by driving the power transistor LT into the saturation state during its switching-on time. For doing so, it is necessary to have a minimum base current supplied to the power transistor at all times of the switching-on duration of the switching-on pulse.

Figure 2A:
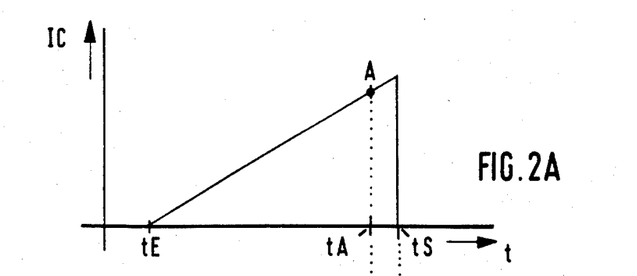
FIGS. 2A, 2B and 2C are diagrams of time-related current curves in the power transistor.
Figure 2B:
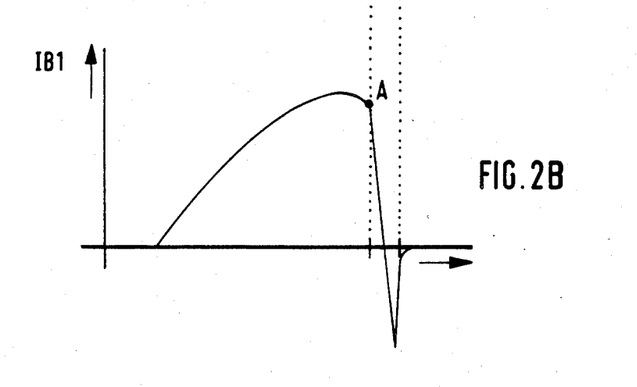

FIGS. 2A and 2B show the collector current IC which increases in ramp-shaped manner and, respectively, the path of the base current IB1 with which the power transistor is driven. The two current curves are determined by the constant passive components of the circuit network surrounding the power transistor.

Due to the fact that the power transistor is driven into the saturation state during its switching-on duration, the power transistor can be switched-off only with a switching-off delay within which the base of the saturated transistor is discharged. Thus, the ramp-shaped increase of the collector current IC does not last only from the switching-on moment tE to the switching-off moment tA of the switching-on pulse supplied to the control transistor ST; the collector current IC returns to zero only after expiration of a storage time tS which effects the switching-off delay. The length of the storage time depends on the steepness of the switching-off base current in the period between the moments tA and tS. Due to the fact that during this switching-off operation, the collector current and the collector voltage of the power transistor simultaneously have finite values, it is possible that considerable power dissipation occurs during this switching-off operation, which may be in the range of up to several hundred watts and which is determinative for the power dissipation in the power transistor to a special degree. In order to reduce the period of time during which such high power dissipation occurs and, furthermore, in order to have the power transistor in due time ready for the next deflection interval, one makes the descending slope of the switching-off base current to be as steep as possible. However, there is a limit to doing so, due to the fact that in case of a too steep descending slope of the switching-off base current an inhomogenuous base discharge is caused which leads to the so-called "emitter crowding" effect, which is an undesired effect. If one makes the descending slope to be too shallow the high power dissipation can occur for too long a period of time and can cause damage to the power transistor. Between these two extremes there is an optimum descending slope which is determined by the dimensioning of the network surrounding the power transistor.

The current gain of the power transistor is a non-linear function of the collector current, with the current gain decreasing to a relatively strong extent when the collector current values become greater. Due to the fact that the path of the base current IB1, which is determined by the circuit network, displays a curve with a monotonously decreasing ascending slope in the switching-on period between tE and tA, the degree of saturation of the power transistor is smaller when the collector current IC at the switching-off moment tA has a larger value, and the degree of saturation is greater when the collector current at the switching-off moment has a smaller value. Due to the fact that the descending slope of the base current is determined by the network surrounding the power transistor, a shorter storage time results in case of greater final values of the collector current and a longer storage time results in case of smaller final values of the collector current.

The horizontal deflection stage has a (not shown) signal processing circuit associated therewith, which determines the deflection frequency and the image position, i.e. the phase position of the deflection signal. This circuit includes a control loop which is usually designated as φ 2 controller and controls the phase position between the line flyback signal and the horizontal generator. The line flyback signal is created when the power transistor becomes highly resistive, i.e. when the collector current IC returns to zero at the end of the storage time tS. In adaptation to the behavior of the network surrounding the power transistor, this control loop is designed such that it effects a discharging time or storage time which is inversely proportional to the final value of the collector current.

The known driving circuits the most typical examples of which are shown in FIGS. 1A, 1B and 1C, are each designed for a specific deflection frequency and for a specific final deflecting current. If a higher deflection frequency is required, e.g. for a video monitor with a higher resolution, or if different final values of the deflecting current and thus of the collector current IC are required, e.g. for different screen sizes and/or for picture tubes with differing maximum deflection angles, the known driving circuits must be designed in a different manner. This means that a correspondingly large number of driving circuits must be made available for the numerous different types of television sets and monitors and that the driving circuits must be given a new design in case of changed requirements.

SUMMARY OF THE INVENTION

It is an object of the invention to improve the driving circuit of the type mentioned at the outset in such a manner that it can be used for any deflection frequencies desired and for any maximum deflecting currents desired, while it is fully compatible with the known $\phi 2$ controller.

In the case of the driving circuit of the type mentioned at the outset, this object is met in that the power transistor has a sensor means associated therewith which supplies to the driving circuit an actual-value signal which is proportional to the instantaneous value of the transistor main current, in that the driving circuit regulates the switching-on base current, during the entire increase thereof and in accordance with said actual-value signal, to a value which maintains the power transistor in the saturated state with only a slight degree of saturation, and in that the driving circuit controls the steepness of the switching-off base current proportionally to the actual-value signal occurring at the end of the switching-on pulse.

Due to the fact that the base current of the power transistor is regulated in accordance with the actual value of its collector current, the driving circuit according to the invention adapts itself automatically to different conditions with respect to the deflection frequency and the maximum deflecting current. Due to the fact that it is possible with this driving circuit to maintain the power transistor, during its entire switching-on duration, at all times in the just saturated range, it is possible to make the storage time very short which may be of particular importance when the number of lines is increased for obtaining a better resolution of specific video monitors, in view of the high deflection frequency which is necessary then. By controlling the descending slope of the switching-off base current proportionally to the final value of the collector current of the power transistor, one imitates the behavior of the conventional driving circuits whose base discharge time or storage time is inversely proportional to the final value of the collector current. The driving circuit according to the invention is therefore fully compatible with the known $\phi 2$ controller, so that this controller can co-operate with the driving circuit according to the invention without having to be modified.

The circuit according to the present invention does not require a transformer which is conventionally employed in the horizontal deflection stage. Thus, there is no need for this relatively expensive and sensitive component part. Furthermore, the driving circuit according to the invention can thus be monolithically integrated without problems. There is the additional advantage that the power transistor can be driven by dc voltage, whereas in case of the conventional solutions only an ac voltage drive is possible due to the transformer. The possibility of an arbitrary dc voltage drive permits that arbitrary intermediate values of the dc voltage may be obtained from the power transistor, so that the power transistor as a dc voltage source can be maintained without problem e.g. in the so-called stand-by operation, in which the television set is turned off only in part.

In a particularly preferred embodiment of the invention, the sensor means is formed by an emitter resistor which is located in the emitter circuit of the power transistor and across which an actual-value voltage is available which is proportional to the collector current of the power transistor. In a further particularly preferred manner, the driving circuit comprises a transconductance stage to which the actual-value voltage obtained from the emitter resistor of the power transistor can be supplied via an actual-value input and which, furthermore, comprises a control output which is connected to the base of the power transistor. The transconductance characteristic of this transconductance stage determines how large the base current is which is supplied to the power transistor at the particular actual-value voltage fed to the transconductance stage. In other words, the shape of the transconductance characteristic determines what base current is fed to the power transistor at the particular collector current measured. Thus, it can be determined through the transconductance characteristic how strong the saturation is into which the power transistor is brought at the particular collector current present.

Figure 2C:
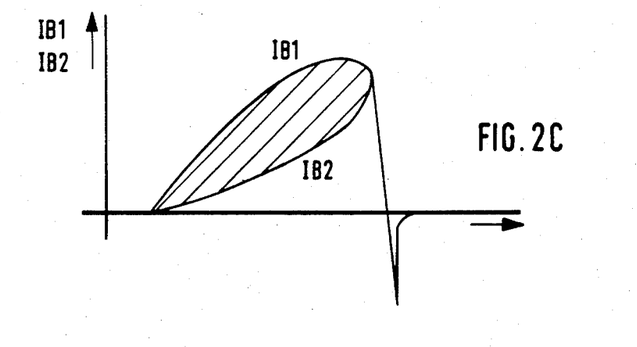

The most favorable result with respect to the reduction of the power dissipation and of the storage time is achieved when the transconductance stage is provided with a non-linear transconductance characteristic which is an inverse copy of the characteristic of the power transistor current gain versus the collector current thereof. Such a transconductance characteristic in the driving circuit leads to a base current curve as it is designated with IB2 in FIG. 2C. Through this $\beta$-inverse base current curve it is paid regard to the fact that the current gain $\beta$ decreases in non-linear manner as the collector current increases. In order to maintain the power transistor just in the saturation state at all times during the entire ramp-shaped increase of its collector current, the base current IB2, in view of this descending $\beta$-path, is increased in the manner shown to an increasingly stronger extent. With this $\beta$-inverse control of the base current IB2, a reduction of the power dissipation according to the hatched area in FIG. 2C is obtained.

In practical application, it is sufficient to imitate the $\beta$-inverse path of IB2 in an approximated manner. For driving circuits according to the invention, with which the circuit expenditure is to be kept as low as possible, it is preferred to use a linear transconductance characteristic with which a linear increase of the base current of the power transistor is controlled. It is still possible thereby to obtain a remarkable reduction of the power losses as well as a considerable reduction of the storage or base discharge time, since the power transistor, especially in case of lower values of the final collector current, is saturated to a much lesser degree than when using the conventional driving circuits which result in the base current path IB1.

A linear transconductance characteristic is of additional advantage when an independence from the transistor type, i.e. from the specific $\beta$-characteristic thereof, is to be achieved in addition to the invariancy of the driving circuit according to the invention with respect to the particular deflection frequency used and with respect to the final value of the collector current which is required in the particular case.

In a particularly preferred manner, the transconductance stage is realized with a voltage-controlled current source.

It is preferred that the tranconductance stage, in response to the fact whether a switching-on pulse is present at the particular moment or not, is adapted to be driven into two different states. During the presence of a switching-on pulse the transconductance stage is put into a first state in which it reacts only to the actual-value voltage supplied thereto, in order to control the increasing switched-on base current. In the second state, which is reached by the transconductance stage upon termination of the switching-on pulse, it reacts to the ratio between the actual-value voltage and a rapidly increasing control voltage having an effect on the base current which is opposite to that of the actual-value voltage, in order to control the decreasing switching-off base current. In this respect, the steepness of the control voltage effective in the second state is adapted to be changed proportionally to the actual-value voltage. With such a transconductance characteristic it is possible to control the descending slope of the switching-off base current in the second state in accordance with the final value which the collector current has reached upon termination of the switching-on pulse, in such a manner that the steepness of the descending slope increases as the final value reached by the collector current increases. In this manner, the operation of discharging the saturated base of the power transistor is terminated within a period of time which is inversely proportional to the final value attained by the collector current, as this is also the case with the known driving circuits. It is ensured by this measure that, with respect to the dependence of the switching-off delay on the final value reached by the collector current, the driving circuit according to the invention behaves in the same manner as the conventional driving circuits and is therefore compatible with the $\Phi 2$ contoller designed for these conventional driving circuits.

In a particularly preferred embodiment of the driving circuit according to the invention, the transconductance stage comprises a differential amplifier and a voltage-current converter circuit which is disposed subsequent to the output of the differential amplifier and the output of which forms the control output of the transconductance stage. The one of the two inputs of the differential amplifier is connected to the actual-value input of the driving circuit, whereas the other input of the differential amplifier is connected to a parallel connection consisting of a capacitor and of the main path of a shunting transistor. The parallel connection is connected at one end to a reference potential, preferably ground, and at the other end to a current source whose current intensity is controllable proportionally to the actual-value voltage. The control electrode of the shunting transistor is connected to the switching-on pulse input of the driving circuit and the shunting transistor is adapted to be switched into the conductive state by the switching-on pulse and otherwise blocks. In this embodiment, the potential at one input of the differential amplifier is maintained at the reference potential via the shunting transistor which is switched into the conductive state during the presence of a switching-on pulse, so that the output voltage of the differential amplifier and thus the switched-on base current delivered from the output of the transconductance stage is influenced in ascending manner only by the actual-value voltage which increases in ramp-shaped manner.

At the end of the particular switching-on pulse, the shunting transistor is then switched into the blocking state, so that the current delivered from the controllable current source and depending with respect to its value on the actual-value voltage can charge the capacitor. The output voltage of the differential amplifier and thus the base current for the power transistor delivered from the transconductance stage are now determined by the ratio between the actual-value voltage on the one side of the differential amplifier and the capacitor charging voltage on the other side of the differential amplifier. Due to the fact that the charging voltage of the capacitor increases rapidly, it becomes increasingly closer to the actual-value voltage of the emitter resistor of the power transistor until it finally catches up with this actual-value voltage and thereafter exceeds this actual-value voltage. As a consequence thereof, the switching-off base current supplied to the base of the power transistor drops rapidly and changes its polarity when reaching the value zero, and from then on it discharges the saturated base and then, when the base is completely discharged, returns to zero. Due to the fact that the rise time of the capacitor charging voltage is proportional to the final value attained by the collector current of the power transistor, it is achieved in this manner that the steepness of the decrease of the switching-off base current is also proportional to this final value of the collector current.

The invention as well as developments thereof will now be explained in more detail on the basis of an embodiment.

DESCRIPTION OF THE PREFERRED EMBODIMENTS

Figure 3:
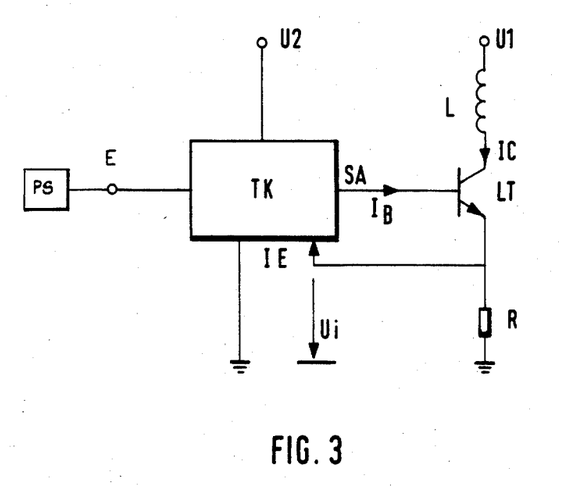
FIG. 3 is a basic block diagram of a preferred embodiment of a driving circuit according to the invention, which is intended to be used for a horizontal deflection stage.

The basic diagram of FIG. 3 displays a power transistor LT whose collector-emitter path is connected in series with the horizontal deflection coil L, as this is also the case with the known driving circuits. At the end which is not connected to the power transistor LT, the horizontal defection coil L is connected to a voltage source U1 which effects a collector current IC increasing in ramp-shaped manner, as shown in FIG. 2A, as long as the power transistor LT is in the saturation state. Between the emitter of the power transistor LT and ground there is connected a sensor resistor R across which an actual-value voltage $U_i$ is available which is proportional to the collector current IC. The base of the power transistor LT is connected to the control output SA of a transconductance stage TK to which the actual-value voltage $U_i$ obtained across the sensor resistor R is supplied via an actual-value input IE and to which line-frequency switching-on pulses are supplied from a pulse source (not shown) via an additional input E. The transconductance stage TK is furthermore connected between a voltage source supplying a voltage U2 and ground, the voltage U2 providing power for the transconductance stage TK.

The transconductance stage TK represents a voltage-controlled current source with the voltage-current conversion behavior or transconductance $$g = I_B/U_i.$$

The characteristic of the transconductance g can be made linear in case of a relatively simple circuit design or non-linear in case of a greater circuit expenditure, in order to take account of the strongly curved path of the current gain $\beta$ of the power transistor as a function of the collector current thereof. In this respect, the transconductance path can be made $\beta$-inverse, at least in approximation. In this case, the transconductance g of the transconductance stage TK is set such that the power transistor LT is just in the saturation state at any value of the collector current which increases in ramp-shaped manner. Thus, it holds that $$I_B = C \cdot \frac{IC}{\beta_{min}(IC)} \qquad (1)$$

and $$I_B = g(U_i) \cdot R \cdot IC \qquad (1)$$

wherein C is the saturation factor and $\beta_{min}$ (IC) is the current gain of the power transistor LT as a function of the collector current IC thereof. The subscript min designates the minimum value of the current gain of the transistor type used as the power transistor as a function of its spread between single specimens of that transistor type. Thus, it follows for the transconductance of the driver circuit:

$$g = I_B/U_i \qquad (3)$$

and $$g = \frac{C}{\beta_{min}(IC) \cdot R} \qquad (4)$$

The time dependency of the positive feedback control loop is determined solely by the load impedance of the power transistor LT and results from the reactance of the deflectional system and of the line transformer. Thus, the driving circuit adapts itself automatically to different operating conditions.

When employing a $\beta$-inverse transconductance path, the switching-on base current IB2 shown in FIG. 2C is obtained. The hatched area in FIG. 2C corresponds to the reduction of the driving power in relation to the conventional driving method which leads to the switching-on base current IB1.

Figure 4:
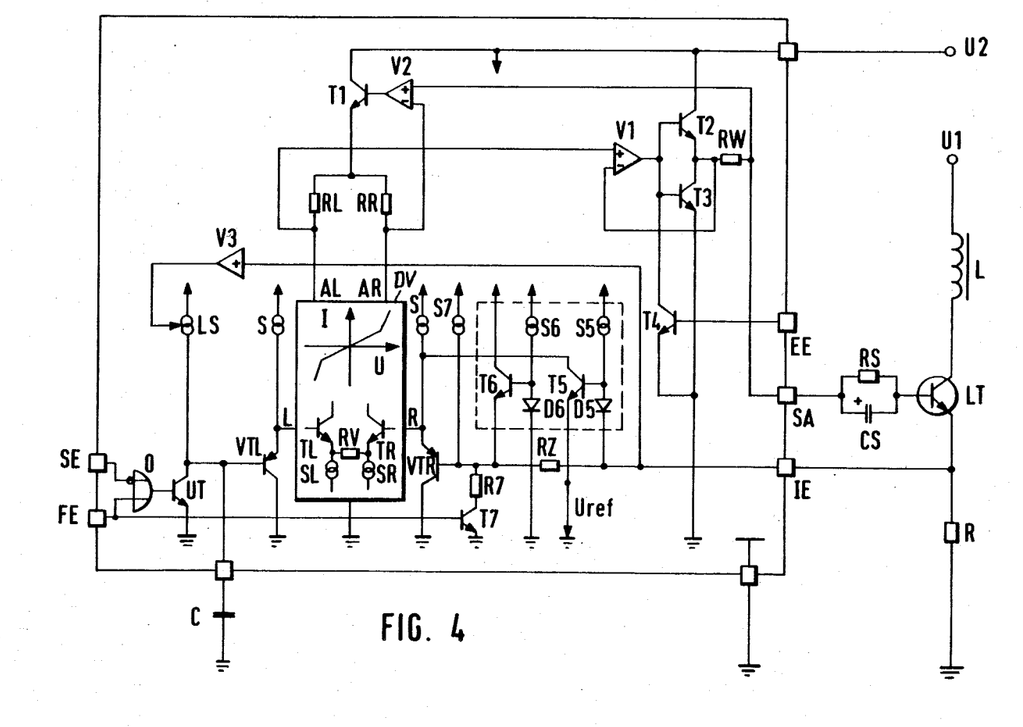
FIG. 4 is a block circuit diagram of a particularly preferred embodiment of the driving circuit according to the invention.

A more detailed circuit diagram of a preferred embodiment of the driving circuit according to the invention, including a circuit part which renders this driving circuit compatible with the known $\phi$ 2-controller, is shown in FIG. 4. The power transistor LT is connected on the collector side to a deflection voltage source U1 via the horizontal deflection coil L, and is connected on the emitter side to ground via the sensor resistor R. The base of the power transistor LT is connected, via a parallel connection consisting of a resistor RS and of a capacitor CS, to the control output SA of a monolithically integrated driving circuit AS. The connecting point between the emitter of the power transistor LT and the sensor resistor R is connected to the actual-value input IE of the driving circuit AS.

Within the driving circuit AS, there is provided a differential amplifier DV which, in conventional manner, has a left-hand input transistor TL and a right-hand input transistor TR, the emitters thereof being each connected to a current source SL and SR, respectively, and furthermore being connected to each other via a connecting resistor RV. Between a left-hand output terminal AL and a right-hand output terminal AR of the differential amplifier DV, a voltage arises which is dependent upon the potential difference between a left-hand input L and a right-hand input R of the differential amplifier DV. With the aid of a voltage-current converter circuit, a current is generated at the control output SA of the driving circuit AS, which is proportional to the voltage between the outputs AL and AR. The voltage-current converter circuit comprises two resistors RL and RR which are connected on the one end to the outputs AL and, respectively, AR of the differential amplifier DV and which are commonly connected on the other end to the emitter of a transistor T1. The collector of the transistor T1 is connected to a supply voltage source U2. The outputs AL and AR are, furthermore, connected to the non-inverting input of an operational amplifier V1 and to the inverting input of an operational amplifier V2, respectively. The output of the operational amplifier V2 is connected to the base of the transistor T1, and the output of the operational amplifier V1 is connected to the base terminals of two additional transistors T2 and T3. The transistors T2 and T3 form, with their collector-emitter paths, a series connection which is connected between the supply voltage source U2 and ground. The connecting point between the emitter of transistor T2 and the collector of transistor T3 is connected to the one end of a current-voltage converter resistor RW, the other end of which is connected on the one hand to the control output SA of the driving circuit AS and on the other hand to the non-inverting input of operational amplifier V2. That end of resistor RW which is connected to the transistors T2 and T3 is furthermore connected to the inverting input of operational amplifier V1.

The current delivered from the common output terminal of the transistors T2 and T3 to the output terminal SA is converted with the aid of the resistor SW into a corresponding voltage which is regulated with the aid of the operational amplifiers V1 and V2 to a voltage value which corresponds to the voltage between output terminals AL and AR of the differential amplifier DV. In this manner, a current is present at the output terminal SA and thus at the base of the power transistor LT, which is dependent upon the potential difference between the inputs L and R of the differential amplifier DV and upon the working characteristic of the differential amplifier DV. This working characteristic determines the transconductance characteristic of the transconductance stage constructed with the differential amplifier and the voltage-current converter circuit. This working characteristic is selected such that the power transistor LT is saturated to the predetermined degree in case of any collector current demanded from the power transistor LT during the duration of the switching-on pulse. If one decides to use a non-linear transconductance behavior, i.e. a β-inverse or approximately β-inverse working characteristic of the differential amplifier DV, this can be realized by connecting additional differential stages, which are biassed in differing manner and thus respond to differring input potentials, in parallel to the differential stage shown in FIG. 4, which comprises the two transistors TL and TR.

The right-hand input R of the differential amplifier DV is connected to the emitter of a right-hand pre-transistor VTR whose collector is connected to ground and whose base is connected via an intermediate resistor RZ and the actual-value input IE to the connecting point between the sensor resistor R and the emitter of the power transistor LT. The left-hand input L of the differential amplifier DV is connected to the emitter of a left-hand pre-transistor VTL whose collector is directly connected to ground and whose base is connected to ground via an external capacitor C. Furthermore, the emitters of the pre-transistors VTR and VTL are each connected to the supply voltage source U2 via a current source S. The capacitor C can be bridged within the integrated driving circuit AS by means of a shunting transistor UT whose emitter is connected to ground and whose collector is connected on the one hand to the capacitor C and the base of the pre-transistor VTL and on the other hand to a controllable current source LS which, in turn, is connected to the supply voltage source U2. The controllable current source LS is controlled via a third amplifier V3 by the actual-value voltage obtained across the sensor resistor R and delivers a current which is proportional to this actual-value voltage. The base of the shunting transistor UT is connected to the output of an OR-circuit O whose two inputs are connected to a control input SE to which the switching-on pulses are supplied, from the pulse source PS (not shown in FIG. 4) and to remote control input FE respectively.

Between the control output SA and the base of the power transistor LT, there is provided a parallel connection which consists of a resistor RS and a capacitor CS and which acts as a negative constant-voltage source during those time intervals in which the switching-off base current of the power transistor LT becomes negative for discharging the base thereof.

The part of the driving circuit AS described so far operates as follows:

At the beginning of a switching-on pulse supplied to the control input SE, the shunting transistor UT is switched into the conductive state, so that it short-circuits the external capacitor C and the left-hand input L of the differential amplifier DV is brought virtually to ground potential and is maintained at ground potential during the entire duration of the switching-on pulse. In contrast thereto, the right-hand input R of the differential amplifier DV is acted upon by the voltage drop across the sensor resistor R. An internally generated quiescent potential at the right-hand input R provides for a basic output current which ensures the beginning of the regenerative feedback in the control loop of the circuit structure and compensates offset errors. As the collector current IC of the power transistor LT increases, the voltage drop across the input R and, thus, the output voltage between the output terminals AL and AR of the differential amplifier DV and, in corresponding manner, the switched-on base current delivered from the control output SA to the base of the power transistor LT increase as well, this increasing taking place in accordance with the working characteristic of the differential amplifier DV. While the collector current IC of the power transistor LT increases in ramp-shaped manner, as shown in FIG. 2A, due to the circuit connected to the collector thereof, a switched-on base current which is determined by the shape of the working characteristic of the differential amplifier DV is delivered to the power transistor LT due to the correspondingly increasing potential at the right-hand input R of the differential amplifier DV, with the switched-on base current displaying the base current path IB2 shown in FIG. 2C when the working characteristic of the differential amplifier DV is β-inverse.

Upon termination of the switching-on pulse, the shunting transistor UT is blocked, so that the external capacitor C can be charged with the charging current delivered from the controllable current source LS, e.g. consisting of or comprising a transistor the control electrode of which is coupled to the emitter of the power transistor LT. This charging current is proportional to the voltage drop present at this moment across the sensor resistor R, and thus it is proportional to the value of the collector current IC of the power transistor LT flowing upon termination of the switching-on pulse. Thus, the higher the final value of the collector current IC upon termination of the switching-on pulse, the higher the charging voltage across the capacitor C.

Thus, starting with the termination of the switching-on pulse, the potential at the left-hand input L of the differential amplifier DV is determined by the charging voltage across the capacitor C. While the potential at the right-hand input R of the differential amplifier DV remains quasi-constant since the collector current IC of the power transistor LT does, relatively speaking, not change significantly any more during the switching-off delay between the moments tA and tS (FIG. 2A), the potential at the left-hand input L of the differential amplifier DV increases rapidly. The potential difference between the input potentials of the differential amplifier DV, thus, decreases rapidly, this resulting in a corresponding decrease of the output voltage between the output terminals AL and AR and, thus, in a corresponding decrease of the switching-off base current supplied to the base of the power transistor LT. When the rapidly increasing potential at the left-hand input L has reached the quasi-constant potential at the right-hand input R, the switching-off base current becomes zero. During the further increase of the potential at the left-hand input L, a voltage which rapidly increases in the opposite direction is then present between the output terminals AL and AR, the consequence of this voltage being a corresponding negative base current of the power transistor LT. This negative base current discharges the saturated base of the power transistor LT, until the power transistor LT finally goes into the blocking state at the moment tS, whereby the collector current IC decreases to zero.

If one did not employ the measure according to the invention, to control the charging current for the capacitor C proportionally to the collector current IC of the power transistor LT but, rather, charged the capacitor C with a current which is independent from the collector current IC so that a fixed descend steepness of the switching-off base current would be obtained as in case of the known driving circuits, the switching-off delay of the power transistor LT would increase as the final value of its collector current IC increases. The novel driving circuit would thus behave in a manner which is opposite to that of the known driving circuits whose switching-off delay becomes shorter as the final value of the collector current increases. Thus, with a constant descend steepness of the switching-off base current, it would not be possible any more to use the novel driving circuit together with the φ 2-control loop which is designed for the conventional driving circuits. This control loop would display a quasi-stable behavior in which a deflection signal of the power transistor with a maximum switching-on duration and maximum collector peak current would be followed by such a deflection signal with minimum current and minimum duration.

This behavior of the power transistor, namely to display a longer storage time when the collector current increases, which is a physically "normal" behavior but disadvantageous when using the conventional φ 2-control loop, is overcome with the measure according to the invention, namely to control the steepness of the descending slope of the base discharge current proportionally to the collector peak current of the power transistor. By the measure according to the invention, to make the steepness of the switching-off base current proportional to the collector peak current and, thus, to make the time required until discharge of the saturated base, i.e. the storage delay time, inversely proportional to the collector peak current, an equal behavior as with the known horizontal deflection stages is achieved in this respect, so that a stable operation of the φ 2-control loop is rendered possible with the driving circuit according to the invention.

Furthermore, in comparison with the conventional driving circuits, the driving circuit according to the invention provides a clearly shorter transient period from switching-on to steady-state operation. In addition thereto, the saturation of the power transistor is guaranteed already in this phase. The conventional solutions require a by far longer transient period, without the power transistor being saturated during this period. Thus, particularly high power dissipation occurs which may affect the reliability and the lifetime of the power transistor. Thus, these problems have been overcome as well with the driving circuit according to the invention.

The particularly preferred embodiment of the invention shown in FIG. 4 displays the following additional features:

As protection against too high current loads of the power transistor LT, there is provided a current limiting circuit in the form of a transistor T5 whose collector is connected to the emitter of the right-hand pre-transistor VTR and whose emitter is connected to a reference voltage source $U_{ref}$. The base of the transistor T5 is connected to the actual-voltage input IE via a diode D5 and to the supply voltage source U2 via a current source S5. When the collector current IC of the power transistor LT, and thus the voltage drop across the sensor resistor R, exceeds a speficic value which depends on the reference voltage source $U_{ref}$, the transistor T5 becomes conductive and limits the potential at the right-hand input R of the differential amplifier DV to a potential value which depends on the reference voltage source $U_{ref}$. The current delivered to the base of the power transistor LT is thereby limited in corresponding manner, this resulting in a limitation of the collector current thereof due to the finite current gain $\beta$ of the power transistor.

A clamp circuit comprising a transistor T6 whose emitter is connected to the actual-value input IE and whose collector is connected to the supply voltage source U2 and whose base is connected on the one hand to ground via a diode D6 and on the other hand to the supply voltage source U2 via a current source S6, prevents the potential at the right-hand input R of the differential amplifier DV from assuming negative values. Without this protective measure, this could happen in case of power transistors having an integrated free-running diode, since the voltage drop at the sensor resistor R reverses in the conductive state of the diode.

During the line flyback signal, high voltage values are present at the power transistor LT. If the power transistor LT were switched on during this phase and if a current flowed therein, very high power dissipation would arise which might destroy the power transistor LT. For preventing this, a transistor T4 is provided whose collector is connected to the common base terminal of the two transistors T2 and T3 and whose emitter is connected to ground. The base of the transistor T4 is connected to a switching-on input EE of the driving circuit AS, and via said input EE the transistor T4 is switched into the conductive state during the presense of the line flyback signal, this resulting in switching-off of the transistors T2 and T3. The power transistor LT is thereby definitely maintained in the switched-off state during the presence of the line flyback voltage.

The remote control input FE of the driving circuit AS is connected to the base of a transistor T7 whose emitter is connected to ground and whose collector is connected via a resistor R7 to the base of the right-hand pre-transistor VTR. The base of said pre-transistor VTR is connected furthermore to the supply voltage source U2 via an additional current source S7. If the television set is switched into the so-called stand-by state, e.g. by means of a remote control, the remote control input FE receives a switching-on signal which switches the shunting transistor UT into the conductive state via the OR-circuit O and which directly switches the transistor T7 into the conductive state. Thus, the left-hand input L of the differential amplifier DV virtually reaches ground potential, and the right-hand input R reaches a potential which depends on the resistor R7 and the current supplied from the current source S7 and which has the result that the power transistor LT is driven with a constant base current.

In the embodiment shown, all transistors are designed as npn-transistors. With a monolithic integration of the driving circuit AS, such transistors are preferred to pnp-transistors because of the lower cut-off frequency of monolithically integrated pnp-transistors. For the same reason, the voltage-current converter circuit following the differential amplifier DV is realized with two amplifiers, which serves to avoid slow pnp-stages.

We claim:

1. A deflectional system of a television set comprising:
a power transistor supplying a deflecting current increasing in ramp-shaped manner to a deflection coil;
sensor means coupled to said power transistor for producing an actual-value signal which is proportional to the instantaneous value of the current flowing in the main path of the power transistor;
pulse source means for periodically supplying switching-on pulses of a duration corresponding to the ramp length of the deflecting current; and
a driving circuit means receiving the switching-on pulses at a first input and the actual-value signal at a second input and having an output which is coupled to the base of the power transistor, with the driving circuit means applying an increasing switched-on base current to the power transistor during the switching-on pulse duration, said switched-on basis current being controlled by the driving circuit means, during the entire increase thereof and in response to the actual-value signal, to a value which maintains the power transistor in the saturated state with only a slight degree of saturation, and with the driving circuit applying to the base of the power transistor, after termination of the switching-on pulse, a switching-off base current which decreases rapidly in relation to the increase of the switched-on base current and finally changes polarity and which effects a rapid return of the power transistor from the saturation state into the blocking state, the driving circuit controlling the steepness of the switching-off base current proportionally to the actual-value signal occuring at the end of the switching-on pulse.

2. A deflectional system according to claim 1, wherein said sensor means comprises a resistor connected to the emitter of said power transistor, across which an actual-value voltage is available which is proportional to the collector current of said power transistor, and wherein said driving circuit means comprises a transconductance stage having an actual-value input and a control output which is coupled to the base of said power transistor, the transconductance characteristic of said transconductance stage being selected such that said transconductance stage, in case of each actual-value voltage supplied thereto, supplies to said power transistor a switched-on base current which effects a saturation of said power transistor with only a slight degree of saturation.

3. A deflectional system according to claim 2, wherein said transconductance stage has a linear transconductance characteristic.

4. A deflectional system according to claim 2, wherein said transconductance stage has a non-linear transconductance characteristic which is an at least approximated inverse copy of the characteristic of the power transistor current gain versus the collector current thereof.

5. A deflectional system according to claim 2, wherein said transconductance stage comprises a voltage-controlled current source which is controllable by said actual-value voltage.

6. A deflectional system according to claim 3, wherein said transconductance stage comprises a voltage-controlled current source which is controllable by said actual-value voltage.

7. A deflectional system according to claim 4, wherein said transconductance stage comprises a voltage-controlled current source which is controllable by said actual-value voltage.

8. A deflectional system according to claim 2, wherein a control voltage source is provided for supplying to the transconductance stage a rapidly increasing control voltage having an effect on the output of the transconductance stage which is opposite to that of said actual-value voltage, wherein said transconductance stage, in dependence of the presence or absence of the switching-on pulse is adapted to be driven into a first state in which it reacts only to the actual-value voltage supplied thereto, in order to control the increasing switched-on base current, and respectively, into a second state in which it reacts to the ratio between said actual-value voltage and the rapidly increasing control voltage, in order to control the decreasing switching-off base current, and wherein the steepness of the control voltage effective in said second state is adapted to be changed proportionally to said actual-value voltage.

9. A deflectional system according to claim 3, wherein a control voltage source is provided for supplying to the transconductance stage a rapidly increasing control voltage having an effect on the output of the transconductance stage which is opposite to that of said actual-value voltage, wherein said transconductance stage, in dependence of the presence or absence of the switching-on pulse is adapted to be driven into a first state in which it reacts only to the actual-value voltage supplied thereto, in order to control the increasing switched-on base current, and respectively, into a second state in which it reacts to the ratio between said actual-value voltage and the rapidly increasing control voltage, in order to control the decreasing switching-off base current, and wherein the steepness of the control voltage effective in said second state is adapted to be changed proportionally to said actual-value voltage.

10. A deflectional system according to claim 4, wherein a control voltage source is provided for supplying to the transconductance stage a rapidly increasing control voltage having an effect on the output of the transconductance stage which is opposite to that of said acutal-value voltage, wherein said transconductance stage, in dependence of the presence or absence of the switching-on pulse is adapted to be driven into a first state in which it reacts only to the actual-value voltage supplied thereto, in order to control the increasing switched-on base current, and respectively, into a second state in which it reacts to the ratio between said actual-value voltage and the rapidly increasing control voltage, in order to control the decreasing switching-off base current, and wherein the steepness of the control voltage effective in said second state is adapted to be changed proportionally to said actual-value voltage.

11. A deflectional system according to claim 5, wherein a control voltage source is provided for supplying to the transconductance stage a rapidly increasing control voltage having an effect on the output of the transconductance stage which is opposite to that of said actual-value voltage, wherein said transconductance stage, in dependence of the presence or absence of the switching-on pulse is adapted to be driven into a first state in which it reacts only to the actual-value voltage supplied thereto, in order to control the increasing switched-on base current, and respectively, into a second state in which it reacts to the ratio between said actual-value voltage and the rapidly increasing control voltage, in order to control the decreasing switching-off base current, and wherein the steepness of the control voltage effective in said second state is adapted to be changed proportionally to said actual-value voltage.

12. A deflectional system according to claim 8, wherein said transconductance stage comprises a differential amplifier and a voltage-current converter circuit which is coupled to the ouput of said differential amplifier and the output of which forms the control output of said transconductance stage, wherein the one of the two inputs of said differential amplifier is coupled to the actual-value input of the driving circuit, and further comprising a parallel connection consisting of a capacitor and a shunting transistor having a main path, a source of reference potential connected to one end of said parallel connection and a controllable current source whose current intensity is proportional to the actual-value voltage connected to the other end of said parallel connection, wherein the other input of said differential amplifier is connected to said other end of the parallel connection, and wherein the control electrode of said shunting transistor is connected to the switching-on pulse source and the shunting transistor is adapted to be switched into the conductive state by the switching-on pulse and otherwise blocks.

13. A deflectional system according to claim 9, wherein said transconductance stage comprises a differential amplifier and a voltage-current converter circuit which is coupled to the output of said differential amplifier and the output of which forms the control output of said transconductance stage, wherein the one of the two inputs of said differential amplifier is coupled to the actual-value input of the driving circuit, and further comprising a parallel connection consisting of a capacitor and a shunting transistor having a main path, a source of reference potential connected to one end of said parallel connection and a controllable current source whose current intensity is proportional to the actual-value voltage connected to the other end of said parallel connection, wherein the other input of said differential amplifier is connected to said other end of the parallel connection, and wherein the control electrode of said shunting transistor is connected to the switching-on pulse source and the shunting transistor is adapted to be switched into the conductive state by the switching-on pulse and otherwise blocks.

14. A deflectional system according to claim 10, wherein said transconductance stage comprises a differential amplifier and a voltage-current converter circuit which is coupled to the output of said differential amplifier and the output of which forms the control output of said transconductance stage, wherein the one of the two inputs of said differential amplifier is coupled to the actual-value input of the driving circuit, and further comprising a parallel connection consisting of a capacitor and a shunting transistor having a main path, a source of reference potential connected to one end of said parallel connection and a controllable current source whose current intensity is proportional to the actual-value voltage connected to the other end of said parallel connection, wherein the other input of said differential amplifier is connected to said other end of the parallel connection, and wherein the control electrode of said shunting transistor is connected to the switching-on pulse source and the shunting transistor is adapted to be switched into the conductive state by the switching-on pulse and otherwise blocks.

15. A deflectional system according to claim 11, wherein said transconductance stage comprises a differential amplifier and a voltage-current converter circuit which is coupled to the output of said differential amplifier and the output of which forms the control output of said transconductance stage, wherein the one of the two inputs of said differential amplifier is coupled to the actual-value input of the driving circuit, and further comprising a parallel connection consisting of a capacitor and a shunting transistor having a main path, a source of reference potential connected to one end of said parallel connection and a controllable current source whose current intensity is proportional to the actual-value voltage connected to the other end of said parallel connection, wherein the other input of said differential amplifier is connected to said other end of the parallel connection, and wherein the control electrode of said shunting transistor is connected to the switching-on pulse source and the shunting transistor is adapted to be switched into the conductive state by the switching-on pulse and otherwise blocks.

* * * * *